United States Patent [19]
McCollum

[11] Patent Number: 5,341,043
[45] Date of Patent: Aug. 23, 1994

[54] SERIES LINEAR ANTIFUSE ARRAY

[75] Inventor: John L. McCollum, Saratoga, Calif.

[73] Assignee: Actel Corporation, Sunnyvale, Calif.

[21] Appl. No.: 954,111

[22] Filed: Sep. 30, 1992

[51] Int. Cl.⁵ .................... H03K 19/177; H01H 37/76
[52] U.S. Cl. ................................ 307/465; 307/202.1; 307/443
[58] Field of Search ............... 307/465, 202.1, 443; 340/825.79, 825.83, 825.84, 825.87, 827; 364/716

[56] References Cited
U.S. PATENT DOCUMENTS

| | | | |
|---|---|---|---|
| 4,677,437 | 6/1987 | Kajiyama et al. | 340/825.83 |
| 4,786,904 | 11/1988 | Graham, III et al. | 307/465 |
| 4,857,774 | 8/1989 | El-Ayat et al. | 307/465 |
| 5,200,652 | 4/1993 | Lee | 307/465.1 |
| 5,223,792 | 6/1993 | El-Ayat et al. | 307/465 |

Primary Examiner—Edward P. Westin
Assistant Examiner—Jon Santamauro
Attorney, Agent, or Firm—D'Alessandro, Frazzini & Ritchie

[57] ABSTRACT

An isolation conductor is provided between a first conductor and a plurality of second conductors to which potential connections can be made from the first conductor. An isolation antifuse is connected between the first conductor and the isolation conductor. Individual antifuses are connected between the isolation bus and each of the plurality of second conductors. A pull-down or pullup transistor is connected between the isolation conductor and a selected circuit node to allow programming of the isolation antifuse and an isolation transistor may be connected between the first conductor and the isolation conductor to allow testing of the isolation conductor.

10 Claims, 4 Drawing Sheets

SERIES LINEAR ANTIFUSE ARRAY

BACKGROUND OF THE INVENTION

1. Field of the Invention

The present invention relates to user-programmable circuits. More particularly, the present invention relates to antifuse-based user-programmable circuit architectures and to a multi-level antifuse interconnection architecture.

2. The Prior Art

In numerous user-configurable architectures employing antifuses, a plurality of antifuses may be provided to potentially connect a given signal line or node to other signal lines or circuit nodes. While providing numerous antifuses on a single conductor enhances the connectability of that conductor and, hence, the versatility of the user-programmable architecture in which the antifuses are employed, a tradeoff is presented between versatility and performance problems and degradation. First, all antifuses common to a signal line which remain unprogrammed in a final configured circuit act as individual capacitors which each contribute capacitance to the total capacitance of the signal line. In addition, antifuses which employ an antifuse material such as amorphous silicon are characterized by some degree of leakage in their unprogrammed state. Depending on the voltage potentials to which the other ends of these antifuses are connected, a random leakage current will be present at nodes, such as conductors, to which more than one unprogrammed antifuse is connected. Finally, experience has shown that unprogrammed antifuses may be subjected to voltage stresses during programming of other antifuses, creating reliability issues for the circuits in which they reside.

A typical example of such antifuse distribution is an interconnect structure including a first conductor running in a first direction which intersects a plurality of second conductors running in a second direction. In order to maximize connectability in a user-programmable interconnect architecture, antifuses are provided at each intersection between the first conductor and one of the second conductors. Programming of all of these antifuses is rare in a given circuit implemented by this architecture. It is plain that the capacitance of the first conductor is significantly affected by the presence of the unprogrammed antifuses which are connected to it, as is the current leakage through that conductor contributed to by each unprogrammed antifuse. Finally, the voltages which must be placed across selected antifuses disposed between the first conductor and selected ones of the second conductors to program them may have an undesired stressing effect on adjoining antifuses which are supposed to remain unprogrammed.

BRIEF DESCRIPTION OF THE INVENTION

According to the present invention, a single antifuse is used to access a small linear array of antifuses. According to a first embodiment of the invention, an isolation conductor is provided between a first conductor and a plurality of second conductors to which potential connections can be made from the first conductor. An isolation antifuse is connected between the first conductor and the isolation conductor. Individual antifuses are connected between the isolation bus and each of the plurality of second conductors. A pull-down or pullup transistor may be connected between the isolation conductor and a selected circuit node to allow programming of the isolation antifuse and an isolation transistor may be connected between the first conductor and the isolation conductor to allow testing of the isolation conductor.

Because most antifuses in a user-programmable circuit, such as an FPGA, are not used and therefore represent purely parasitic capacitive load for no useable purpose once a part is programmed, it is possible to reduce the capacitance on the first conductor and thereby increase the speed by utilizing one isolation antifuse to access a small linear array of antifuses.

The technique of the present invention can also reduce the leakage and stress on antifuses. Hence if an antifuse, such as one utilizing an amorphous silicon antifuse layer, has a significant leakage, the total background current in the integrated circuit can be greatly reduced. In addition, stressing of unprogrammed antifuses is likewise reduced and can lead to improved reliability.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
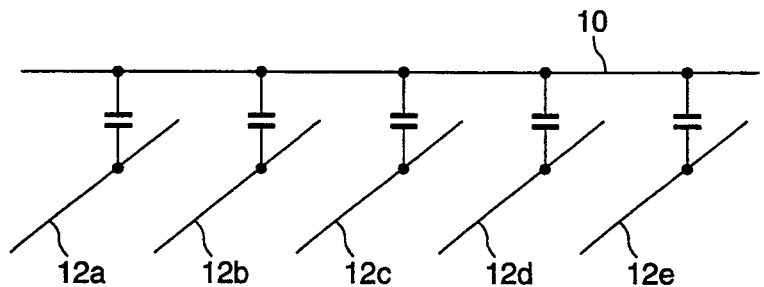
FIG. 1 is a schematic diagram of the architecture of a typical prior art antifuse-based interconnection apparatus.

Referring first to FIG. 1, a schematic diagram of the architecture of a typical prior art antifuse-based interconnection apparatus is presented. In such an architecture, it is common that only a single one of the antifuses will be programmed to connect the first line 10 to one of the plurality of second lines 12a through 12e. As is well understood in the art, an antifuse may be programmed by placing a programming potential between the conductor 10 and the one of the conductors 12a–12e connected to the antifuse to be programmed. For example, a programming voltage is placed across conductors 10 and 12a to program the leftmost antifuse. Those of ordinary skill in the art will recognize that the remaining unprogrammed antifuses comprise components of parasitic capacitance, as well as potential sources of leakage current.

Figure 2:
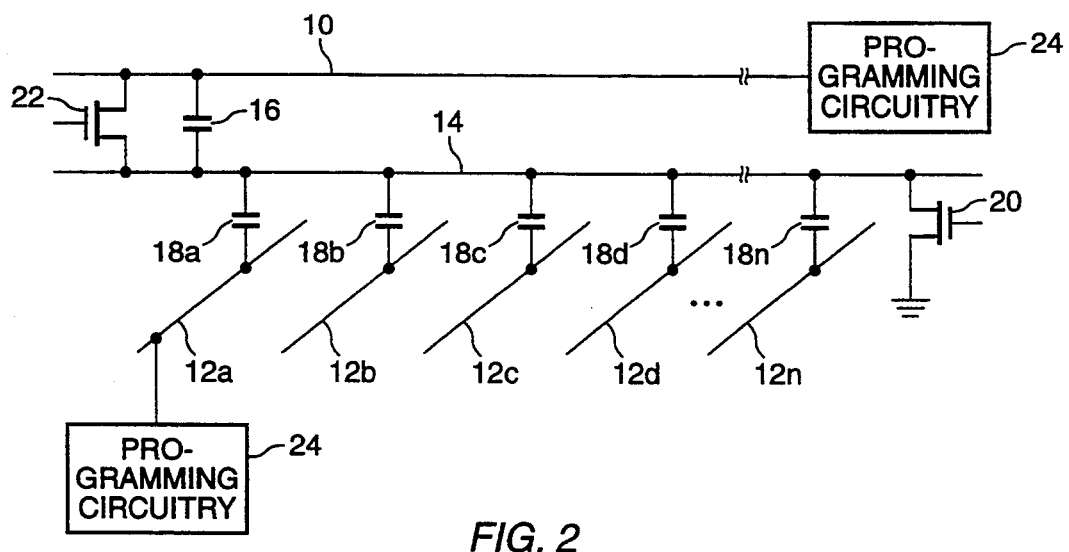
FIG. 2 is a schematic diagram of an interconnection apparatus according to a presently preferred embodiment of the present invention.

Referring now to FIG. 2, according to the present invention, a single antifuse is used to access a small linear array of antifuses. As shown in the embodiment of the invention depicted in FIG. 2, and like in the prior art arrangement depicted in FIG. 1, a first conductor 10 may be connected to any of a plurality of second conductors 12a–12n. However, unlike in the embodiment of FIG. 1, individual antifuses are not directly connected between the first conductor 10 and each of the second conductors 12a–12n. Instead, an isolation conductor 14 is employed and an isolation antifuse 16 is connected between first conductor 10 and isolation conductor 14. A plurality of individual antifuses 18a–18n are provided, respectively connected between isolation conductor 14 and individual ones of second conductors 12a–12n to which potential connections can be made from the first conductor.

Additional circuitry is required to program isolation antifuse 16. According to a presently preferred embodiment of the invention, a pull-down or pull-up transistor is connected between isolation conductor 14 and a selected circuit node to allow programming of the isolation antifuse. In the embodiment of FIG. 2, an N-channel MOS transistor 20 is shown connected as a pull-down transistor between isolation conductor 14 and a suitable potential, shown as ground in FIG. 2. In order to program isolation antifuse 16, a suitable programming potential $V_{pp}$ is placed on first conductor 10 and pull-down transistor 20 is turned on, thus placing the $V_{pp}$ programming potential directly across isolation antifuse 16.

After isolation antifuse 16 has been programmed, any one of individual antifuses 18a–18n may be programmed in one of two ways. According to one programming method, a first voltage potential may be placed on first conductor 10 and a second voltage potential may be placed on any one of second conductors 12a–12n to program the one of individual antifuses 18a–18n, where the difference between the first and second voltage potentials is equal to $V_{pp}$. The remaining ones of the second conductors 12a–12n whose antifuses are to remain unprogrammed may be connected to a source of voltage potential having a value such as $V_{pp}/2$ to prevent them from being stressed while the desired antifuse is programmed. According to another programming method, a potential $V_{pp}$ may be placed on any one of second conductors 12a–12n and the pull-down transistor 20 may be turned on to program the one of the individual antifuses 18a–18n located between the chosen second conductor 12a–12n and isolation conductor 14. In this embodiment too the remaining ones of the second conductors 12a–12n whose antifuses are to remain unprogrammed may be connected to a source of voltage potential having a value such as $V_{pp}/2$ to prevent them from being stressed while the desired antifuse is programmed. Methods and circuitry for providing programming potentials to selected conductors in integrated circuits are well known. Non-exhaustive examples of such methods and circuitry are disclosed in U.S. Pat. Nos. 4,758,745, and 4,873,459, which are expressly incorporated herein by reference.

Those of ordinary skill in the art will recognize that two antifuses must be programmed to make a cross-net connection between first conductor 10 and any one of second conductors 12a–12n. This does increase the resistance of the net over the prior art embodiment of FIG. 1 which requires only a single antifuse to make the same connection. However, since unused linear busses in the embodiment of the invention shown in FIG. 2 represent significantly reduced capacitance, leakage, and stress, these reductions provide an extremely acceptable tradeoff for the resistance increase.

In order to test the structure, an additional device such as N-channel isolation transistor 22 may be connected between first conductor 10 and isolation conductor 14 to allow testing of isolation conductor 14. To test that the isolated conductor 14 does uniquely exist (as well as the required contacts and vias), pull-down transistor 20 may be used to sink current through isolation transistor 22. These transistors are thus preferably located on the opposite end of the physical layout of isolation conductor 14 from. By turning off the pull-down and turning on the isolation transistor the antifuse device can be stressed to assure reliability. Since the isolation transistor is only used in testing and not programming the device can be a minimum geometry device.

Finally, as will be appreciated by those of ordinary skill in the art, programming circuitry 24 is connected to conductor 10. Similar programming circuitry is also connected to conductors 12a–12n, but only programming circuitry 24 is shown connected to conductor 12a in order to avoid overcomplicating the drawing. Programming circuitry 24 may be conventional programming circuitry well known in the art, such as is disclosed, for example, in U.S. Pat. Nos. 4,758,745, and 4,873,459.

Figure 3A:
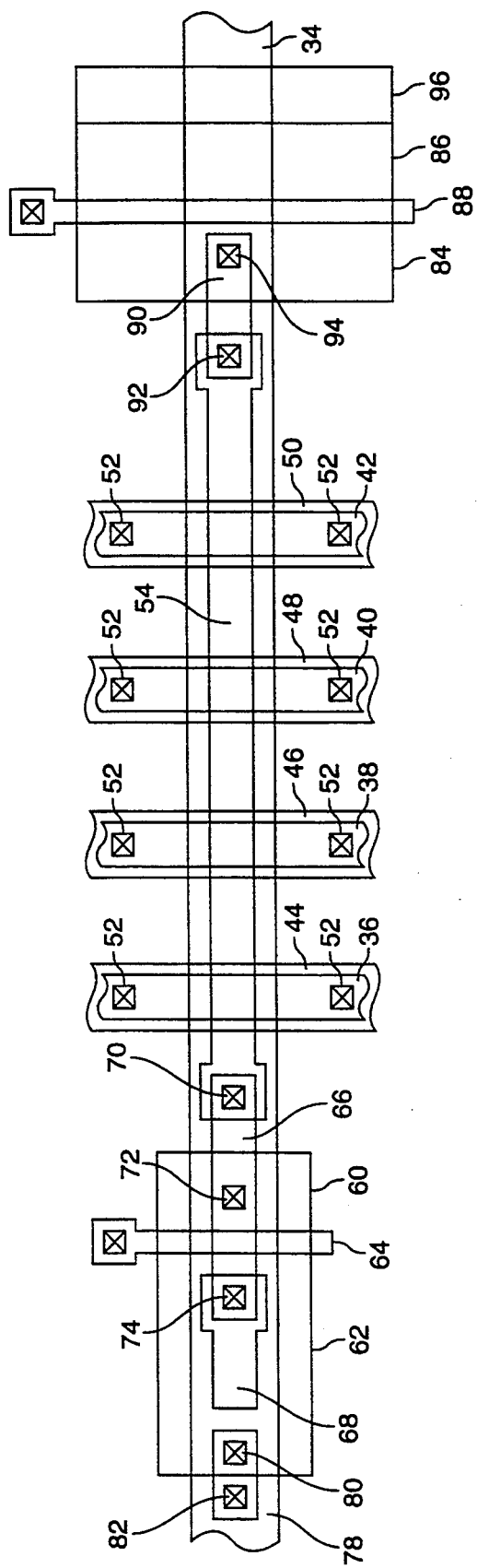
FIGS. 3a and 3b are top and cross-sectional views, respectively, of an illustrative layout of the structure of FIG. 2, shown as it would be built using an antifuse having a polysilicon upper electrode, an oxide-nitride-oxide sandwich antifuse material, and a substrate diffusion region as a lower electrode.
Figure 3B:
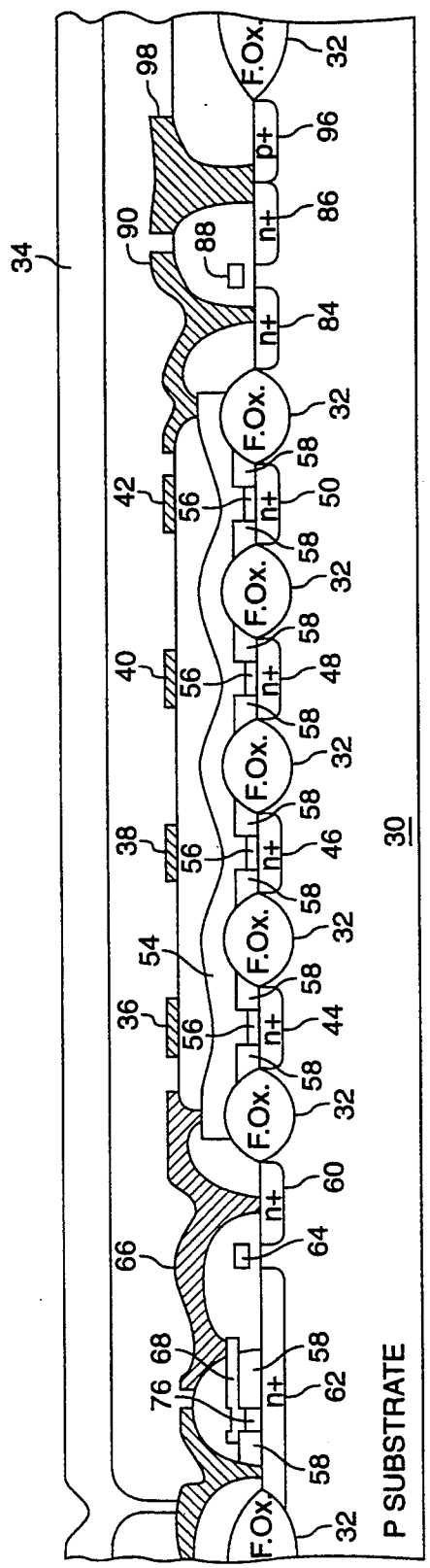

Referring now to FIGS. 3a and 3b, top and cross-sectional views, respectively, of a sample layout of a portion of the structure of FIG. 2 are shown as it would be built using an antifuse having a polysilicon upper electrode, an oxide-nitride-oxide sandwich antifuse material, and a substrate diffusion region as a lower electrode. The layout of the embodiment of FIGS. 3a and 3b shows four second conductors intersecting a first conductor which are selectively connectable to it using antifuses. An actual embodiment of this layout preferably employs silicided polysilicon and junctions to reduce resistance.

The circuit depicted in FIGS. 3a and 3b is fabricated on a semiconductor substrate 30, typically p-type material. Conventional locos processing methods may be used to form active regions separated by field oxide regions 32. Other conventional processing steps are used to form the diffused n-type regions which will comprise the active circuit elements in the substrate, and the various other layers which make up the structure.

First conductor 10 comprises second level metal line 34 and first level metal lines 36, 38, 40, and 42 comprise second conductors 12a–12d. Diffused n-type regions 44, 46, 48, and 50 form the lower electrodes of individual antifuses 18a–18d and are stitched to first level metal lines 36, 38, 40, and 42 by a plurality of contacts 52 as is well known in the art.

Polysilicon line 54 comprises isolation bus 14 and forms the common upper electrode for individual antifuses 18a–18d. The antifuse material layers 56 for individual antifuses 18a–18d can be seen in the windows formed in oxide layer 58 disposed between polysilicon line 54 and diffused regions 44, 46, 48, and 50, respectively.

N-channel isolation transistor 22 has diffused region 60 as its source, diffused region 62 as its drain, and polysilicon gate 64. First level metal region 66 connects the source 60 of isolation transistor 22 to polysilicon line 54 and the polysilicon region 68, forming the upper electrode of isolation antifuse 16, by contacts 70, 72, and 74. Isolation antifuse 16 is disposed between polysilicon region 68 and drain diffusion region 62 and its antifuse material layer 76 may be seen in the window formed in oxide layer 58. The drain 62 of isolation transistor 22 is connected to first conductor metal layer 34 by way of first level metal region 78 and contacts 80 and 82.

Diffused region 84 forms the drain of pull-down transistor 20, diffused region 86 forms its source, and polysilicon region 88 forms its gate. Isolation conductor 14 comprising polysilicon line 54 is connected to the drain diffusion 84 of pulldown transistor 20 via first level metal region 90 and contacts 92 and 94. P-type diffusion 96 forms a substrate tap to ground with metal strap 98 as is well known by those of ordinary skill in the art.

Figure 4:
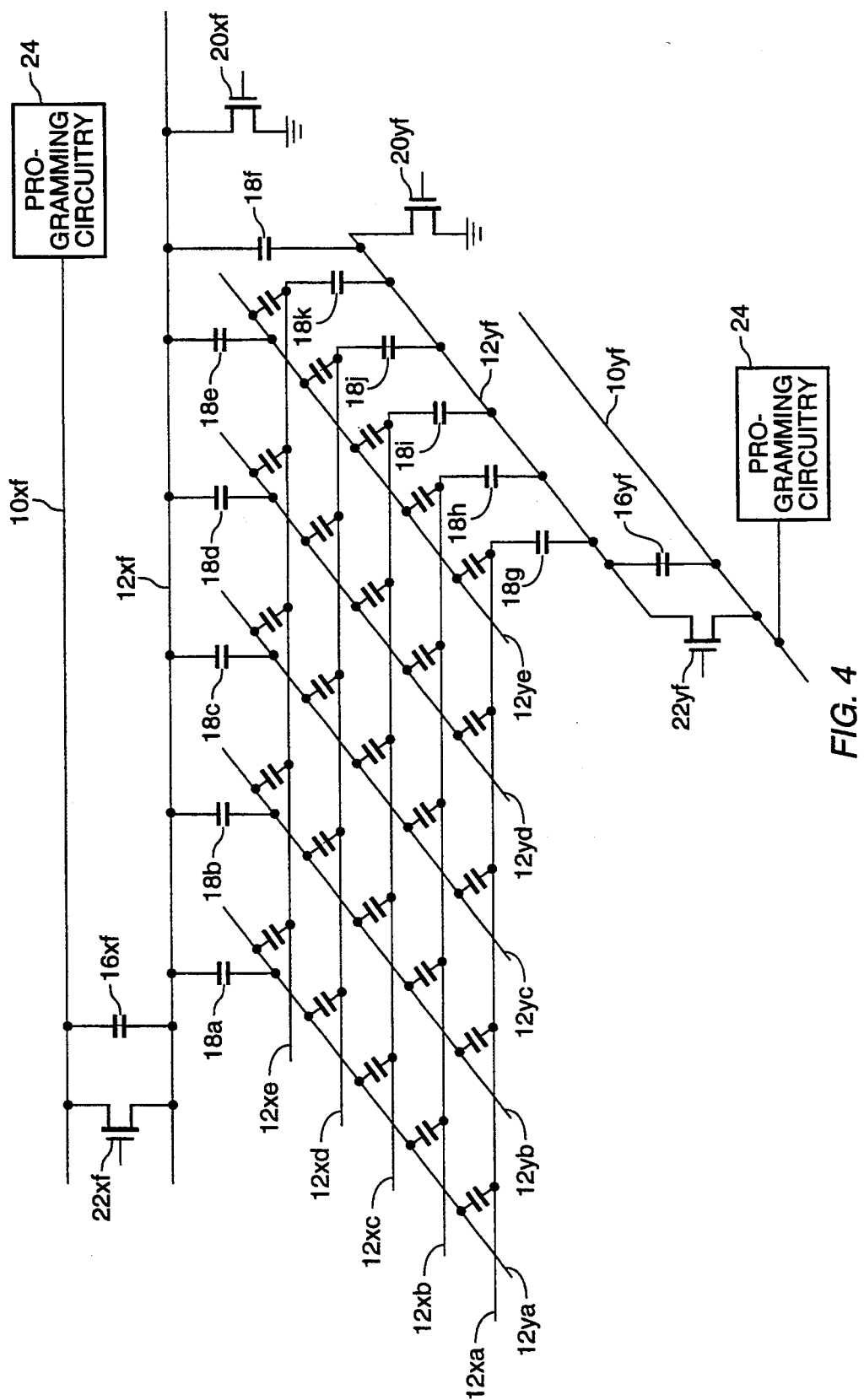
FIG. 4 is a schematic diagram of an interconnection apparatus in two dimensions according to a presently preferred embodiment of the present invention.

Referring now to FIG. 4, it is seen that the isolation conductor concept of the present invention disclosed herein may be extended into two dimensions. A matrix of conductors comprises conductors 12xa–12xf running in a first direction and conductors 12ya–12yf running in a second direction. The second direction is preferably orthogonal to the first direction, but it need not be, so long as the x and y conductors form intersections.

According to a preferred embodiment of the invention, an antifuse element is disposed at each intersection connecting the intersecting conductors. Those of ordinary skill in the art will recognize that fewer than all of the intersections may be populated by antifuses, depending on design considerations. Antifuses 18a–18f are shown connected at the intersections of conductor 12xf and conductors 12ya–12yf. Antifuses 18g–18k are shown connected at the intersections of conductor 12yf and conductors 12xa–12ye. The other antifuses are shown but not numbered in the matrix to avoid confusing the drawing.

X-oriented conductor 10xf is connectable to x-oriented conductor 12xf through an isolation antifuse 16xf. Y-oriented conductor 10yf is connectable to y-oriented conductor 12yf through an isolation antifuse 16yf. Isolation transistors 22xf and 22yf are present for shunting antifuses 16xf and 16yf as in the embodiment of FIG. 2 and pull-down transistors 20xf and 20yf are also present. As in the embodiment of FIG. 2, conventional programming circuitry is connected to conductors 10xf and 10yf. As will be appreciated by those of ordinary skill in the art, the x and y conductors in the matrix act as complementary isolation conductors for one another in the same manner as in the one dimensional case.

Those of ordinary skill in the art will recognize that conductors 12xa–12xe and 12ya–12ye are connected to conductors like 12xf and 12yf through isolation antifuses and isolation transistors and are connected to pulldown transistors in a manner identical to that shown for conductors 10xf and 12xf and 10yf and 12yf and that they are omitted from the drawing simply because it cannot accommodate that much detail.

The method for programming antifuses in the apparatus of FIG. 4 may be identical to the programming operation for its components in the x and y directions as described with respect to FIG. 2. As an example, to program antifuse 18f, isolation antifuses 16xf and 16yf may first be programmed using transistors 20xf and 20yf as described in the one-dimensional embodiment. The matrix antifuse 18f may then be programmed by placing the programming potential across conductors 10xf and 10yf. Alternatively, antifuse 18f may be programmed first by placing the programming potential across conductors 10xf and 10yf and turning on transistors 22xf and 22yf, followed by programming antifuses 16xf and 16yf using transistors 20xf and 20yf as described previously.

Those of ordinary skill in the art will realize that, in the embodiment of FIG. 4, three antifuses are required to make a cross connection between any two intersecting lines. Such an architecture would have the benefit of having minimal capacitance and leakage, and would require a very simple programming algorithm. The expense of these advantages would, of course, be the overhead of additional programming transistors and antifuses, which results in a larger integrated circuit.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a user-programmable interconnect architecture wherein potential connections may be made between a first interconnect conductor and a plurality of second interconnect conductors, interconnection apparatus including:
   an isolation conductor;
   a plurality of connection antifuses, a different one of said connection antifuses connected between said isolation conductor and each one of said plurality of second interconnect conductors;
   a single isolation antifuse connected between said first interconnect conductor and said isolation conductor, said single isolation antifuse and said isolation conductor acting to limit parasitic capacitance of said first interconnect conductor to a value less than the capacitance of said isolation antifuse; and
   programming means for programming said isolation antifuse.

2. The interconnection apparatus of claim 1 further including an isolation transistor connected between said first interconnect conductor and said isolation conductor.

3. The interconnection apparatus of claim 1 wherein said programming means comprises:
   a transistor connected between said isolation conductor and a circuit node which may be held at a first voltage potential; and
   circuit means for connecting a second voltage potential to said first interconnect conductor, the difference between said first and second voltage potentials being sufficient to program said isolation antifuse.

4. The interconnection apparatus of claim 3 wherein said transistor is a pull-down transistor.

5. A programmable interconnect architecture comprising:
   a first interconnect conductor;
   a plurality of second interconnect conductors; forming intersections with said first conductor;
   a plurality of antifuses, individual ones of said antifuses disposed at said intersections;
   an isolation conductor;
   a single isolation antifuse connected between said first interconnect conductor and said isolation conductor, said single isolation antifuse and said isolation conductor acting to limit parasitic capacitance of said first interconnect conductor to a value less than the capacitance of said isolation antifuse; and
   programming means for programming said isolation antifuse.

6. The programmable interconnect architecture of claim 5 further including an isolation transistor connected between said first interconnect conductor and said isolation conductor.

7. The programmable interconnect architecture of claim 5 wherein said programming means comprises:

a transistor connected between said isolation conductor and a circuit node which may be held at a first voltage potential; and circuit means for connecting a second voltage potential to said first interconnect conductor, the difference between said first and second voltage potentials being sufficient to program said isolation antifuse.

8. The programmable interconnect architecture of claim 7 wherein said transistor is a pull-down transistor.

9. In a user-programmable interconnect architecture wherein potential connections may be made between a first interconnect conductor and a plurality of second interconnect conductors, said architecture further including interconnection apparatus comprising an isolation conductor, a single isolation antifuse connected between said first interconnect conductor and said isolation conductor, a plurality of connection antifuses, a different one of said connection antifuses connected between said isolation conductor and each one of said plurality of second interconnect conductors, and programming means for programming said isolation antifuse, wherein said isolation antifuse and said isolation conductor act to limit parasitic capacitance of said first interconnect conductor to a value less than the capacitance of said isolation antifuse, a method for forming a connection between said first interconnect conductor and a selected one of said second interconnect conductors, including the steps of:

programming said isolation antifuse; and placing a programming voltage potential across said isolation conductor and said selected one of said second conductors.

10. A user-programmable interconnect architecture comprising:

a plurality of first conductors running in a first direction;

a plurality of second conductors running in said first direction, each of said second conductors associated with a different one of said first conductors;

a plurality of third conductors running in a second direction not parallel to said first direction;

a plurality of fourth conductors running in said second direction, each of said second conductors associated with a different one of said third conductors, said fourth conductors forming intersections with said second conductors;

a plurality of connection antifuses, a different one of said antifuses connected between intersecting ones of said second and fourth conductors;

a first isolation transistor connected between each said first conductor and its associated second conductor;

a single first isolation antifuse connected between each said first conductor and its associated second conductor, said single first isolation antifuse and said second conductor acting to limit parasitic capacitance of said first conductor to a value less than the capacitance of said isolation antifuse;

a second isolation transistor connected between each said third conductor and its associated fourth conductor;

a single second isolation antifuse connected between each said third conductor and its associated fourth conductor, said single second isolation antifuse and said fourth conductor acting to limit parasitic capacitance of said third conductor to a value less than the capacitance of said isolation antifuse;

means for selectively connecting each of said second and fourth conductors to a first voltage potential; and circuit means for selectively connecting a second voltage potential to ones of said first and third conductors, the difference between said first and second voltage potentials being sufficient to program said first and second isolation antifuses.

* * * * *

UNITED STATES PATENT AND TRADEMARK OFFICE
CERTIFICATE OF CORRECTION

PATENT NO. : 5,341,043
DATED : August 23, 1994
INVENTOR(S) : John L. McCollum

It is certified that error appears in the above-indentified patent and that said Letters Patent is hereby corrected as shown below:

On column 4, line 6, replace "end" with --ends--.
On column 4, line 7, after "from" insert --one another--.

Signed and Sealed this

Twenty-eight Day of March, 1995

Attest:

BRUCE LEHMAN

*Attesting Officer*     *Commissioner of Patents and Trademarks*